United States Patent [19]
Mundt et al.

[11] Patent Number: 5,472,565
[45] Date of Patent: Dec. 5, 1995

[54] TOPOLOGY INDUCED PLASMA ENHANCEMENT FOR ETCHED UNIFORMITY IMPROVEMENT

[75] Inventors: Randall S. Mundt, Pleasanton; David R. Kerr, Santa Clara; Eric H. Lenz, Palo Alto, all of Calif.

[73] Assignee: Lam Research Corporation, Fremont, Calif.

[21] Appl. No.: 153,084

[22] Filed: Nov. 17, 1993

[51] Int. Cl.$^6$ .................. B08B 7/00; C23F 1/02
[52] U.S. Cl. ............... 216/71; 156/345; 204/192.32; 204/298.33
[58] Field of Search .............. 204/298.31, 298.33, 204/298.39, 192.32; 156/643, 646, 345

[56] References Cited

U.S. PATENT DOCUMENTS

| | | | |
|---|---|---|---|
| 4,610,774 | 9/1986 | Sakata et al. | 204/298 |
| 4,724,060 | 2/1988 | Sakata et al. | 204/298 |
| 4,780,169 | 10/1988 | Stark et al. | 204/298.33 X |
| 4,792,378 | 12/1988 | Rose et al. | 156/643 |
| 4,820,371 | 4/1989 | Rose | 156/345 |
| 4,960,488 | 10/1990 | Law et al. | 204/298.33 X |

FOREIGN PATENT DOCUMENTS 104625  5/1986  Japan ................ 204/298.33

*Primary Examiner*—Nam Nguyen
*Attorney, Agent, or Firm*—Burns, Doane, Swecker & Mathis

[57] ABSTRACT

A plasma discharge electrode having a front surface with a central portion thereof including outlets for discharging reactant gas which forms a plasma and a peripheral portion substantially surrounding the outlets. The peripheral portion has at least one recess for locally enhancing a density of the plasma formed by the electrode. The recess can be formed in a replaceable insert and the electrode can be made from a single crystal of silicon.

18 Claims, 3 Drawing Sheets

TOPOLOGY INDUCED PLASMA ENHANCEMENT FOR ETCHED UNIFORMITY IMPROVEMENT

BACKGROUND OF THE INVENTION

1. Field of the Invention

The present invention generally relates to etching with high energy radiation or plasma, and more particularly, to a method and apparatus for controlling the etching rate at the edge of a wafer in an integrated semiconductor circuit manufacturing process.

2. Description of the Related Art

Since the mid-1960s, integrated semiconductor circuits have become the primary components of most electronics systems. These miniature electronic devices may contain thousands of the transistors and other circuits that make up the memory and logic subsystems of microcomputer central processing units. The low cost, high reliability, and speed of these computer chips has led them to become a ubiquitous feature of modern digital electronics.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering to produce other metal films.

For example, U.S. Pat. Nos. 4,610,774 ("the '774 patent") and 4,724,060 ("the '060 patent") to Sakata et al. disclose a target for sputtering and a sputtering apparatus for use in integrated circuit manufacturing. FIG. 2 of the '774 patent illustrates a planar magnetron sputtering electrode device for forming a composite film on a substrate. The sputtering electrode has a projecting middle annular target member made of molybdenum, an outer annular target member made of silicon, and a disc-like inner target member which is also made of silicon. The middle target may also include an erosion member in the form of a V-shaped groove, W-shaped, rectangular shaped, or double rectangular shaped groove, as illustrated in FIGS. 1, 5, 6, and 7 of the '774 patent. FIG. 8 of the '774 patent illustrates another planar magnetron sputtering electrode including a wall provided at a circumferential position surrounding the outer silicon target member. It is disclosed that the wall may be maintained at the same, or lower, electric potential as the major surface of each target member in order to repulse and return electrons which tend to escape from the target area. As a result, the plasma density within the outer region can be increased in order to enhance the sputtering yield associated with an annular plasma at the outer position.

FIG. 1 of the '060 patent shows a planar magnetron sputtering apparatus including a target member having a plurality of recesses so that the sputtering particles are blocked by the side walls of the recesses whereby an even film may be deposited on a stepped substrate without forming any overhanging shapes on the substrate surface. The recesses may take on various shapes as illustrated in FIGS. 5–11 of the '060 patent.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive, material called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating covering the resist.

The lithographer resist pattern is then transferred onto the underlying crystalline surface of the semiconductor material through a process known as etching. Traditional etching processes employed wet chemicals that proved to be limited in terms of the size and aspect ratio (i.e., the height to width ratio of the resulting notch) of the features that could be formed on the wafer. Consequently, the number of circuits that could be packed onto a single wet-etched wafer, and hence the ultimate size of the electronic device, were limited by traditional chemical etching processes.

Dry plasma etching, reactive ion etching, and ion milling techniques were later developed in order to overcome the limitations associated with chemical etching. Plasma etching, in particular, allows the vertical etch rate to be made much greater than the horizontal etch rate so that the resulting aspect ratio of the etched features can be adequately controlled. In fact, plasma etching enables very fine features with high aspect ratios to be formed in films approaching 1 micrometer in thickness.

During the plasma etching process, a plasma is formed above the masked surface of the wafer by adding large amounts of energy to a gas at low pressure. This is commonly accomplished by creating electrical discharges in gases at about 0.001 atmospheres. The resulting plasma may contain ions, free radicals, and neutral species with high kinetic energies. By adjusting the electrical potential of the substrate to be etched, the charged particles in the plasma can be directed to impinge upon the unmasked regions of the wafer and thereby knock out atoms in the substrate.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,792,378 and 4,820,371 to Rose et al. disclose a shower head electrode for distributing gas through a number of holes in the electrode. These patents generally describe a gas dispersion disk having an arrangement of apertures which is tailored to the particular pressure gradients existing within a reactor chamber in order to provide a uniform flow of gas vapors to a semiconductor wafer. The gas dispersion disk is intended to function as a selective barrier to counteract gradient pressures below the disk and to provide a uniform flow through the shower head electrode for distribution over the entire surface of the wafer.

Since the integrated circuit fabrication process is quite sensitive to both particulate and impurity contamination, even airborne particulate matter as small as 1 micrometer must be prevented from contacting the surface of the wafer during the etching process. Consequently, it is often desirable to confine the plasma to the area which is immediately over and around the wafer substrate. However, physically confining the plasma in this manner has been found to cause reduced plasma densities at the edges of the plasma discharge, thus reducing etching rates near the edges of the wafer. For example, the '774 patent discloses an annular wall around a sputtering target that can repulse, and return toward the center, those electrons which tend to escape from the plasma during the sputtering process. Any discontinuities or irregularities in the plasma discharge system, such as pumping ports, may also affect the density of the plasma being discharged.

Conventional attempts to uniformly distribute confined plasmas, or to redistribute the plasma near the edges of the electrode, have been found to cause other undesirable changes in etching process parameters such as etch selectivity and etch profile. Furthermore, even after optimizing process variables such as pressure, power, and gas flow, it is often impossible compensate for this edge effect without adversely affecting other process variables. Therefore, there is a significant need in the art to control the plasma density, especially near the edges of a plasma discharge, without upsetting other process parameters such as etch selectivity and etch profile.

SUMMARY OF THE INVENTION

The present invention generally relates to a method and apparatus whereby topography, or surface contour effects, can be used to enhance a local plasma density. For example, the present invention may be applied to plasma etching processes in order to enhance the density of a plasma at the edge of a plasma shower head electrode of a parallel plate plasma reaction chamber so as to produce a more uniform etch rate without causing undesirable changes in etching process parameters such as etch selectivity and etch profile. Although the present invention will be described in terms of its advantages for semiconductor manufacturing processes, the present invention is also useful for other fields that may require plasmas with uniform densities such as plasma ashing, plasma enhanced chemical vapor deposition, plasma chromatography, plasma diagnostics, and nuclear fusion.

The present invention provides a plasma discharge electrode which can be made from a silicon single crystal having a central portion and a peripheral portion which locally enhances a density of a plasma formed by the electrode. The peripheral portion can include at least one recessed portion in a surface of the electrode facing a semiconductor wafer.

The recessed portion may include one or more grooves extending part way or completely around the central portion of the electrode. For example, two concentric grooves can extend substantially around the central portion of the electrode. A width of the groove may be between 5 and 50 times a mean free path of a molecule in a gas discharged from the electrode. The shape of the groove can be U-shaped, V-shaped, channel-shaped, or any combination thereof. The groove may also include one or more inlets for delivering a gas to the peripheral portion of the electrode and the groove may be formed in a replaceable insert mounted in the peripheral portion of the electrode.

The recessed portion of the plasma discharge electrode may further include a plurality of depressions arranged around the peripheral portion of the electrode. A width of the depressions is preferably between 5 and 50 times a mean free path of a molecule in the plasma discharged from the electrode. A shape of at least one of the depressions may be selected from the group consisting of cylindrical, conical, elliptical, hemispherical, rectangular, or any combination thereof. At least one of the depressions may include means for delivering a gas to the peripheral portion of the electrode. At least one of the depressions may be formed in a replaceable insert which is mounted in the peripheral portion of the electrode.

The electrode and/or the insert may be formed of any suitable material such as graphite, silicon, and aluminum.

The present invention also relates to a method of treating an article with a plasma including the steps of forming plasma between an article and the discharge electrode, the electrode having a peripheral portion including at least one recessed portion. The method includes locally enhancing the density of the plasma adjacent the peripheral portion. The method may also include a step of injecting gas into the recessed portion.

The present invention offers several advantages over conventional technology. First, it allows for the localized enhancement, or intensification, of the density of the plasma which is discharged near the edge of the silicon wafer in order to compensate for normal diffusion losses. The shape, dimension, and number of recessed portions, grooves, or depressions may be optimized to provide uniform etching for a variety of different process regimes. Furthermore, the etch uniformity may be optimized without changing, interfering, or interacting with other process characteristics such as etch selectivity and etch profile. Moreover, the present invention is simpler, less expensive, and more stable than other techniques for locally enhancing plasma density such as magnetic confinement, RF coupling impedance, and material selection. The present invention is also suitable for many different electrode materials, plasma, and process gases due to its simple geometry which is easy to manufacture and use with various insert materials.

BRIEF DESCRIPTION OF THE DRAWINGS

The invention will now be further described with reference to the following figures.

DETAILED DESCRIPTION OF THE INVENTION

According to one aspect of the present invention, it is possible to advantageously apply a "hollow cathode" effect toward solving problems associated with prior art plasma discharge electrodes of the shower head type.

The hollow cathode effect is a phenomenon by which the intensity of a plasma discharge can be greatly increased inside an enclosed volume of limited size, such as a hollow cylinder or tube. It has been found that the intensity of the plasma may be most significantly enhanced when the width of the enclosed volume is on the order of five to fifty times the mean free path of a molecule in the plasma. As is well known in the art, the mean free path (sometimes abbreviated as "mfp") is the distance a molecule travels before collision with another molecule. For example, Argon gas at 300 m Torr and 20° C. has a mean free path of 0.003 inches and a resulting hollow cathode effect can be obtained with an enclosed volume of about 0.015 to 0.150 inches.

By opening various portions of an enclosed volume in a hollow cathode, the intensified plasma may be accurately controlled and uniformly aimed at a target. For example, although a round opening at the end of a cylindrical enclosure has been found to greatly enhance the density of plasma which is discharged through the opening, a rectangular opening which is perpendicular to the end of the tube has been found to produce less density enhancement with greater uniformity at the edges of the discharged plasma. Consequently, it has been found that the density and edge uniformity of a plasma being discharged from a hollow cylindrical cathode may be controlled by varying the shape of the opening from the hollow cathode, such as by changing the angle of truncation at the end of the cylinder from round, to elliptical, to rectangular.

Figure 1:
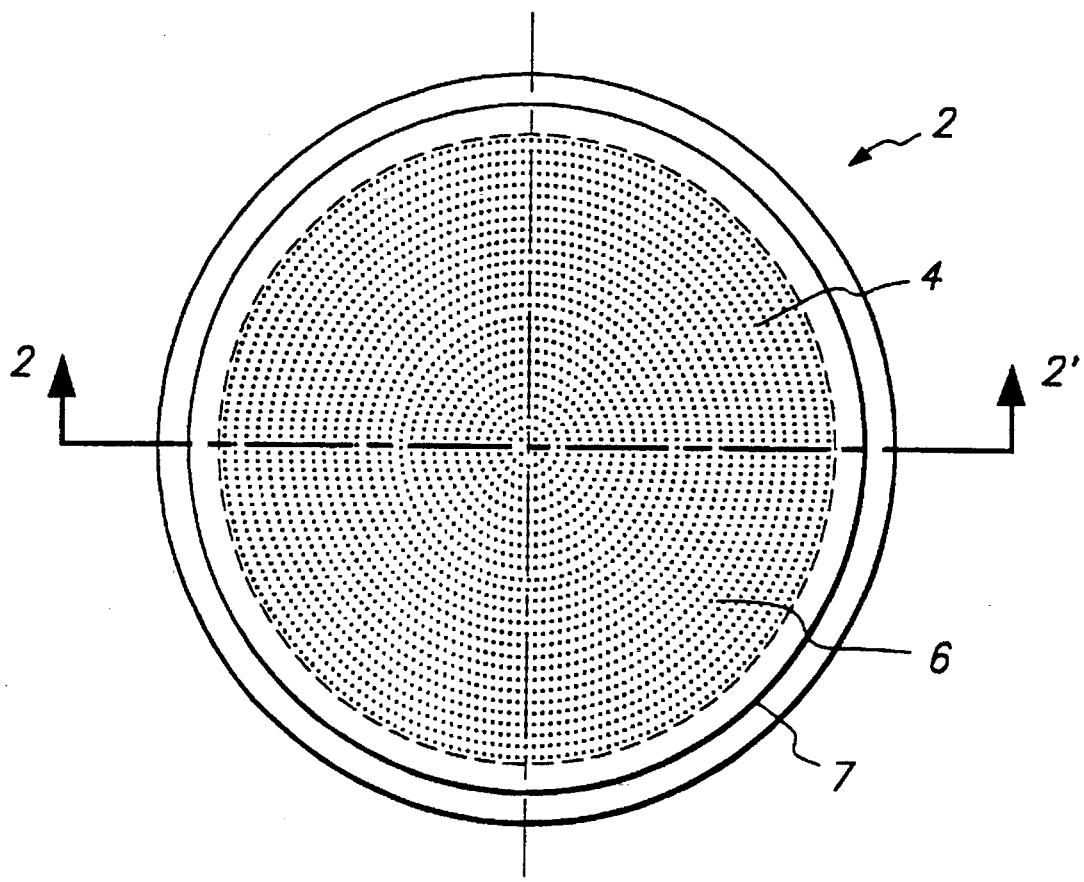
FIG. 1 shows a plan view of a conventional shower head electrode.
Figure 2:
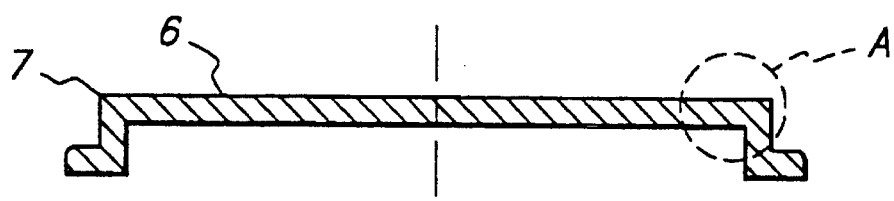
FIG. 2 shows a cross section taken along section line 2—2' of the conventional shower head electrode in FIG. 1.

FIG. 1 shows a plan view of a conventional shower head electrode 2 while FIG. 2 shows a cross section taken along section 2—2' of the conventional shower head electrode 2 shown in FIG. 1. A shower head electrode is one type of plasma electrode that may be used with the present invention. The conventional shower head electrode 2 includes a plurality of outlets 4 in a central portion of a front surface 6 for discharging reactant gas from the rear surface into an area near the front surface 6 of the electrode 2. The front surface 6 may include any surface which is not discontinuous with the center of the front surface 6 up to comer 7. A peripheral portion of the front surface 6, which is illustrated in FIG. 1 without any outlets 4, surrounds the central portion of the front surface 6.

Plasma is typically formed by adding large amounts of energy to a low pressure gas exiting the front surface 6 of the conventional shower head electrode 2. The plasma is then typically biased toward a semiconductor wafer (not shown) for etching the masked surface of the wafer.

Figure 3:
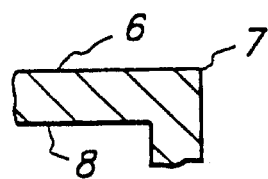
FIG. 3 shows a partial cross section from detail "A" in FIG. 2.

FIG. 3 shows a partial cross section from detail "A" in FIG. 2. FIG. 3 illustrates the front surface 6 of the conventional electrode 2 which is uniformly flat and includes outlets 4 in the central portion of front surface 6. Alternatively, the conventional shower head electrode 2 may include a curved front surface 6 which has approximately the same radius of curvature across the entire front surface 6. In other words, with the conventional shower head electrode 2 illustrated in FIG. 1, the topography of the front surface 6 is substantially uniform, even near the peripheral portion, or outer edge, of the front surface 6.

Figure 4:
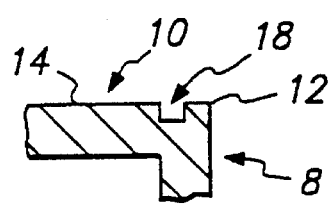
FIG. 4 shows a partial cross section of a plasma discharge electrode in accordance with the invention including a channel-shaped groove.

FIG. 4 shows a partial cross section of a plasma discharge electrode 8 in accordance with the one embodiment of the present invention. FIG. 4 illustrates the front surface 10 having a nonuniform topography near a peripheral edge portion 12 of the front surface 10. A nonuniform topography is used here to mean a variation in the surface features on the front surface 10 of the electrode 8. For example, since the front surface on a conventional shower head electrode includes a flat surface with a plurality of small outlets, a nonuniform topography would be one that is not flat and/or includes other surface features besides such outlets.

The nonuniform topography at the peripheral edge portion 12 of the front surface 10 helps to topographically enhance a local density of a plasma which is formed adjacent the front surface 10 of the electrode 8. Although a plasma may be formed simultaneously over both central portion 14 and the peripheral portion 12 of the electrode, the topographically enhanced density of the plasma may be stronger adjacent peripheral edge 12 of the electrode. This local plasma enhancement may be caused, at least in part, by the hollow cathode effect described above.

Although any appropriate nonuniform topography may be used with the present invention, FIGS. 4–13 illustrate various nonuniform topographies including at least one recessed portion in the front surface 10 of the electrode 8. For example, FIG. 4 illustrates a channel-shaped groove 18 which may extend substantially around, or encircle, the peripheral edge 12 of the front surface 10 of the electrode 8. The channel-shaped groove 18 may have a square bottom, as illustrated in FIG. 4, or another shape such as a curved bottom.

Figure 5:
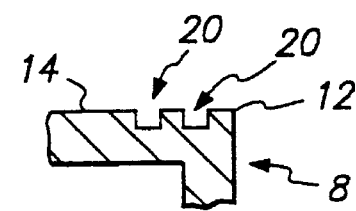
FIG. 5 shows a partial cross section of a plasma discharge electrode in accordance with the invention including two channel-shaped grooves.
Figure 6:
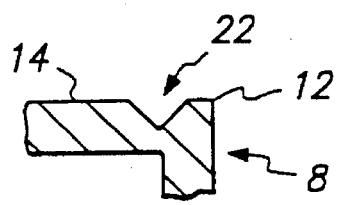
FIG. 6 shows a partial cross section of a plasma discharge electrode in accordance with the invention including a V-shaped groove.
Figure 7:
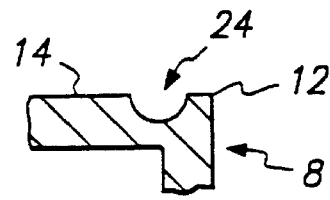
FIG. 7 shows a partial cross section of a plasma discharge electrode in accordance with the invention including a hemispherical groove.
Figure 8:
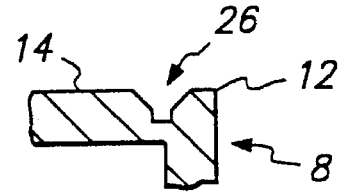
FIG. 8 shows a partial cross section of a plasma discharge electrode in accordance with the invention including a combination V-shaped and channel-shaped groove.
Figure 9:
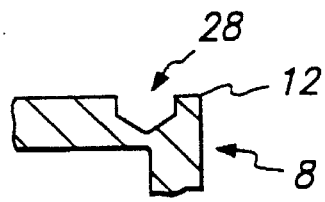
FIG. 9 shows a partial cross section of a plasma discharge electrode in accordance with the invention including a reversed combination V-shaped and channel-shaped groove.

FIG. 5 shows a partial cross section including two channel-shaped grooves 20. In fact, any number of recessed portions, such as channel-shaped grooves 20 may be arranged to extend around the peripheral portion 12 or perimeter, of the front surface 10 of the electrode. The recessed portion may be formed from a variety of shapes such as a V-shaped groove 22 as illustrated in FIG. 6 or a U-shag groove 24 as illustrated in FIG. 7. The V-shaped groove helps allow for improved performance over an extended range of pressures for the gas being discharged from the electrode. Alternatively, the recessed portion may be formed from a combination of shapes such as the combination V-shag and channel-shaped groove 26 in FIG. 8 and the reverse combination V-shaped and channel-shaped groove 28 in FIG. 9. The shape of the various grooves may be chosen to compensate for erosive wear of the electrode 8 near the groove.

The width of the grooves may be chosen in accordance with reactor temperature, plasma reactant gas composition and/or reactor pressure so as to be 5 to 50 times the mean free path of a molecule in the plasma formed over the electrode. For example, molecules in an argon plasma at 300 m Torr and 20° C. have a mean free path of about 0.003 inches and in such a case the groove may have a width of about 0.015 to 0.150 inch.

Figure 10:
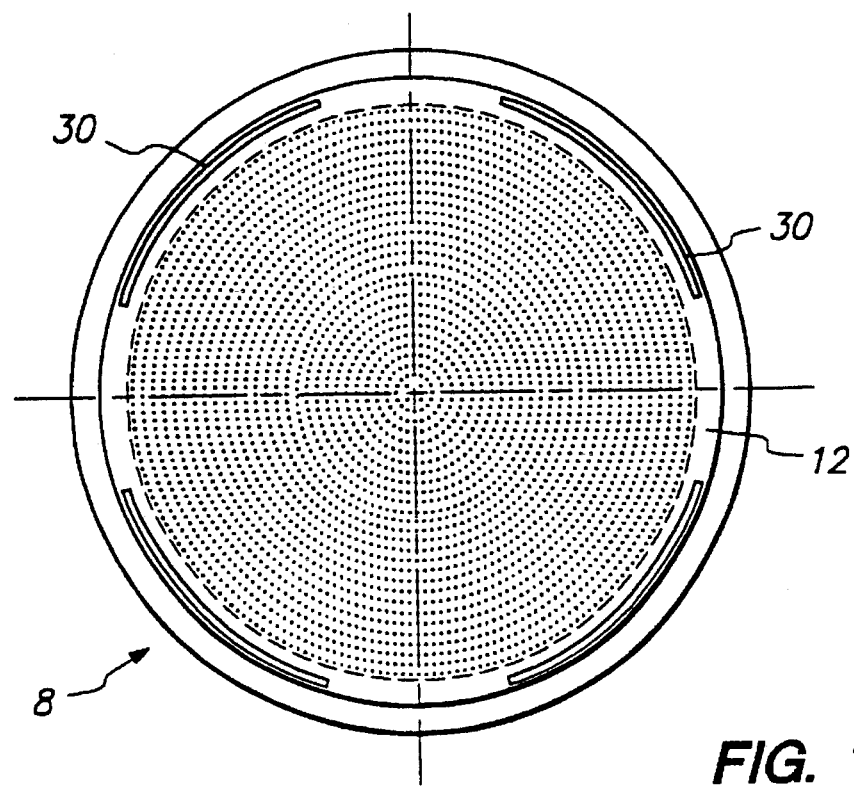
FIG. 10 shows a plan view of a plasma discharge electrode in accordance with the present invention including a segmented groove.

Although the recessed portions illustrated in FIGS. 4–9 may extend substantially around the peripheral edge 12 or perimeter of the front surface 10 of the electrode 8, it is also possible to include several recessed portions which extend only pan way around the perimeter of the electrode 8. For example, FIG. 10 shows a plan view of a plasma discharge electrode in accordance with the present invention including a segmented groove 30. Although FIG. 10 shows a groove 30 which has been segmented into four roughly equal parts, any number of parts in any arrangement may also be used. The segmented groove 30 may be formed in a variety of shapes, such as those illustrated in FIGS. 4–9.

Figure 12:
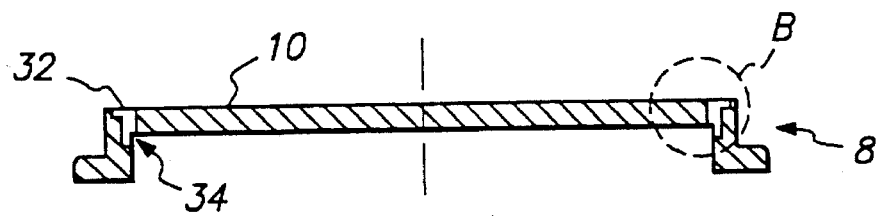
FIG. 12 shows a cross section along section line 12—12' in FIG. 11.
Figure 11:
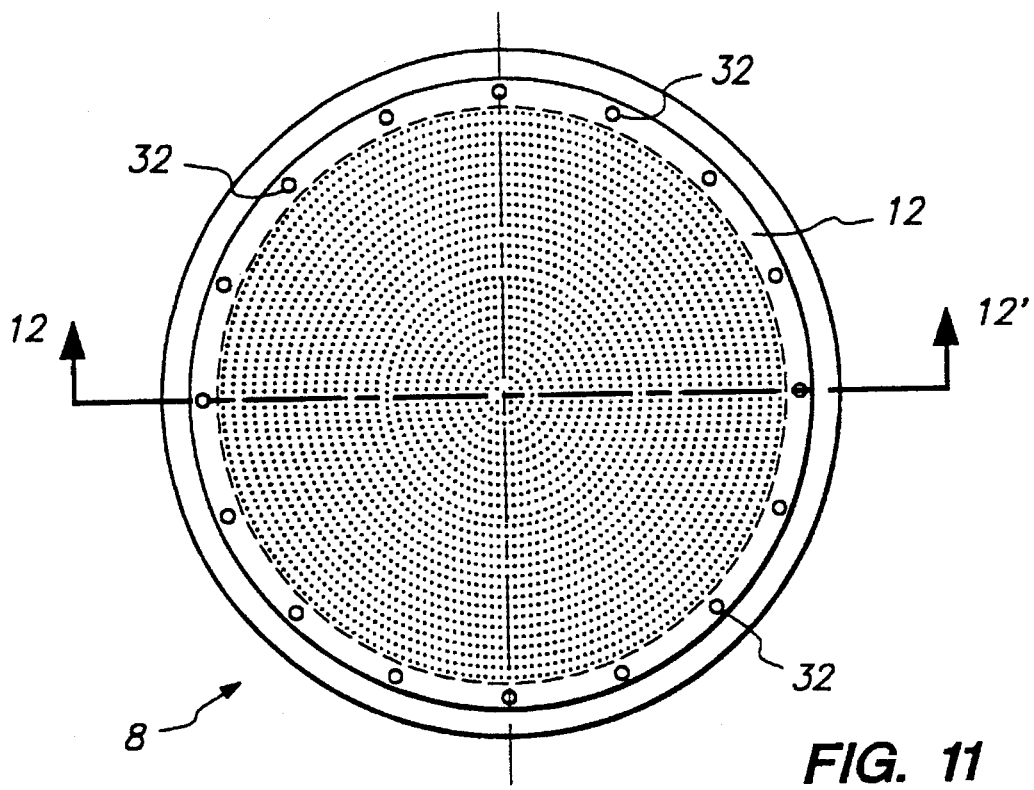
FIG. 11 shows a plan view of a plasma discharge electrode in accordance with the present invention including a plurality of depressions.

FIG. 11 shows a plan view of a plasma discharge electrode in accordance with the present invention including a plurality of depressions 32 arranged around the perimeter or peripheral portion 12 of the front surface 10. Although the depressions may be evenly distributed around the perimeter of front surface 10 as in FIG. 11, the depressions 32 may also be arranged in other patterns. The shape of the depressions 32 may be shapes such as cylindrical, elliptical, conical, hemispherical, rectangular, or any combination thereof. Consequently, the cross section of the depressions 32 may appear similar to those illustrated in FIGS. 4 through 9 for the grooves. The shape of the various depressions 32 may also be chosen to compensate for any erosive wear of the electrode 8 near the depressions 32. As illustrated in FIG. 12, the depressions 32 may include one or more inlets 34 for allowing reactant gas to flow from a chamber such as a baffle chamber behind the electrode 8. Alternatively, the inlets 34 may receive reactant gas from another source, for example, using a conduit (not shown). A variety of different gasses and/or reactant agents may thus be introduced into the depressions 32. Controlling the amount and types of gasses which are supplied to the front surface 10 through inlets 34 and depressions 32 helps allow for better control of the plasma. The peripheral grooves, which were discussed above, may also include similar means for delivering gas, and/or other fluids, to the front surface 10 via the recessed grooves.

Figure 13:
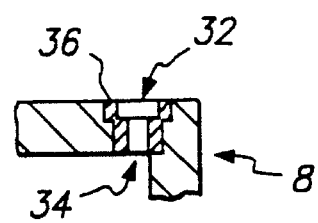
FIG. 13 shows a partial cross section from detail "B" in FIG. 12 including a replaceable insert.

FIG. 13 shows a partial cross section from detail "B" in FIG. 12. FIG. 13 illustrates a replaceable insert 36 which may be used to form the depressions 32 with inlets 34 in the electrode 8. The insert 36 may also be used with depressions that do not have inlets 34. Likewise, the peripheral grooves, discussed above may include similar inserts for forming the recessed portions in FIGS. 4–10. The inserts 36 may be chosen from a material which is consumed during the plasma discharge process or from a material which is resistant to wear. Using a replaceable insert helps provide for the use of normally incompatible chemistries such as an oxygen etching gas and a graphite electrode. The inserts 36 may help protect the electrode 8 from being eroded by plasma and/or reactant fluid flowing through depressions 32 and any conduit connected thereto.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. An electrode useful in a plasma reaction chamber, comprising:

one or more outlets in a central portion of the electrode for discharging reactant gas outwardly of an exposed surface of the electrode; and a groove in the exposed surface, the groove being located at a peripheral portion of the electrode and extending at least partly around the central portion of the electrode, the groove being effective for topographically enhancing a local density of the plasma formed adjacent the exposed surface of the electrode.

2. The plasma electrode as claimed in claim 1, wherein said peripheral portion of the electrode includes a second groove in said exposed surface of the electrode.

3. The plasma electrode as claimed in claim 2, wherein said grooves extend completely around said central portion of the electrode.

4. The plasma electrode as claimed in claim 3, wherein one of said grooves includes means for discharging gas from said peripheral portion of the electrode.

5. The plasma electrode as claimed in claim 4, wherein said grooves are formed in a replaceable insert mounted in said peripheral portion of the electrode.

6. The plasma electrode as claimed in claim 1, wherein a width of said groove is between 5 and 50 times a mean free path of a molecule of the plasma formed by the electrode.

7. The plasma electrode as claimed in claim 1, wherein a shape of said groove is selected from the group consisting of U-shaped, V-shaped, channel-shaped, or any combination thereof.

8. The plasma electrode as claimed in claim 1, wherein said groove includes means for discharging gas from said peripheral portion of the electrode.

9. The plasma electrode as claimed in claim 1, wherein said groove is formed in a replaceable insert mounted in said peripheral portion of the electrode.

10. The plasma electrode as claimed in claim 1, wherein the electrode comprises a single crystal of silicon.

11. The plasma electrode as claimed in claim 1 wherein the electrode forms part of a semiconductor etching apparatus.

12. The plasma electrode as claimed in claim 1, wherein the groove has a width of 0.015 to 0.150 inch.

13. The plasma electrode as claimed in claim 1, wherein the groove is a channel-shaped groove extending completely around the central portion of the electrode.

14. A method of treating an article with a plasma using an electrode having a central portion and a peripheral portion surrounding the central portion, the peripheral portion including a groove in an exposed surface of the electrode and extending at least partly around the central portion of the electrode, the groove being effective for topographically enhancing a local density of the plasma formed adjacent the exposed surface of the electrode, said method comprising the steps of:

discharging reactant gas from a central portion of the electrode;

forming a plasma adjacent an exposed portion of the electrode, the plasma being in contact with the central and peripheral portions of the electrode; and topographically enhancing a density of the plasma at the peripheral portion of the electrode by contact of the plasma with surfaces of the electrode forming the groove.

15. The method as claimed in claim 14, further comprising a step of discharging gas from the groove.

16. The method as claimed in claim 14, further comprising a step of etching a semiconductor wafer with the plasma.

17. The method as claimed in claim 14, wherein the groove has a width of between 5 and 50 times a mean free path of a molecule of the reactant gas.

18. The method as claimed in claim 14, wherein the groove is a channel-shaped groove extending completely around the central portion of the electrode.

* * * * *